United States Patent
Yamano et al.

(10) Patent No.: US 10,100,221 B2
(45) Date of Patent: Oct. 16, 2018

(54) METHOD OF PRODUCING STRUCTURE CONTAINING PHASE-SEPARATED STRUCTURE, BLOCK COPOLYMER COMPOSITION, AND ORGANIC SOLVENT USED FOR BLOCK COPOLYMER COMPOSITION

(71) Applicant: TOKYO OHKA KOGYO CO., LTD., Kawasaki-shi (JP)

(72) Inventors: Hitoshi Yamano, Kawasaki (JP); Tasuku Matsumiya, Kawasaki (JP); Tsuyoshi Kurosawa, Kawasaki (JP); Taku Hirayama, Kawasaki (JP); Ken Miyagi, Kawasaki (JP); Katsumi Ohmori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/149,515

(22) Filed: May 9, 2016

(65) Prior Publication Data

US 2016/0333217 A1 Nov. 17, 2016

(30) Foreign Application Priority Data

May 11, 2015 (JP) ................. 2015-096328

(51) Int. Cl.
   *H01L 21/027* (2006.01)
   *C09D 153/00* (2006.01)
   *G03F 7/00* (2006.01)

(52) U.S. Cl.
   CPC ......... *C09D 153/00* (2013.01); *G03F 7/0002* (2013.01); *H01L 21/0271* (2013.01)

(58) Field of Classification Search
   CPC .............................. B05D 3/0466; B05D 7/544
   See application file for complete search history.

(56) References Cited

U.S. PATENT DOCUMENTS 9,188,869 B2     11/2015   Seshimo et al.
2007/0122741 A1*  5/2007   Hatakeyama ............. G03F 7/11
                                                        430/270.1

(Continued)

FOREIGN PATENT DOCUMENTS

JP     2008-036491 A     2/2008
JP     2013-212569 A    10/2013
JP     2015-044186 A     3/2015

OTHER PUBLICATIONS

Web capture of http://sevierlab.vet.cornell.edu/resources/Chemical-Resistance-Chart-Details.pdf, confirmed available on Jan. 6, 2013 via Internet Wayback Machine (Year: 2013).*

(Continued)

*Primary Examiner* — Nathan H Empie
(74) *Attorney, Agent, or Firm* — Knobbe Martens Olson & Bear LLP

(57) ABSTRACT

A method of forming a structure containing a phase-separated structure, the method including applying a block copolymer composition including an organic solvent component (S) and a block copolymer in which a block of polystyrene or a polystyrene derivative is bonded to at least one kind of block to a substrate to form a layer containing the block copolymer; and phase-separating the layer containing the block. The value of an interaction distance $Ra_{PS}(MPa^{1/2})$ between the Hansen solubility parameter of the organic solvent component (S) and the Hansen solubility parameter of polystyrene or the polystyrene derivative satisfying the following formula (1).

$$4.1 \leq Ra_{PS} \leq 9 \qquad (1)$$

1 Claim, 1 Drawing Sheet

(56) References Cited

U.S. PATENT DOCUMENTS

2014/0335324 A1* 11/2014 Kim .................. B44C 1/227
                                                    428/195.1
2015/0034595 A1    2/2015 Seshimo et al.

OTHER PUBLICATIONS

Hinsberg et al., Self-Assembling Materials for Lithographic Patterning: Overview, Status and Moving Forward, Proceedings of SPIE, vol. 7637, 76370G-1-76370G-11, 2010.
Office Action in Japanese Patent Application No. 2015-096328, dated Aug. 7, 2018.

* cited by examiner

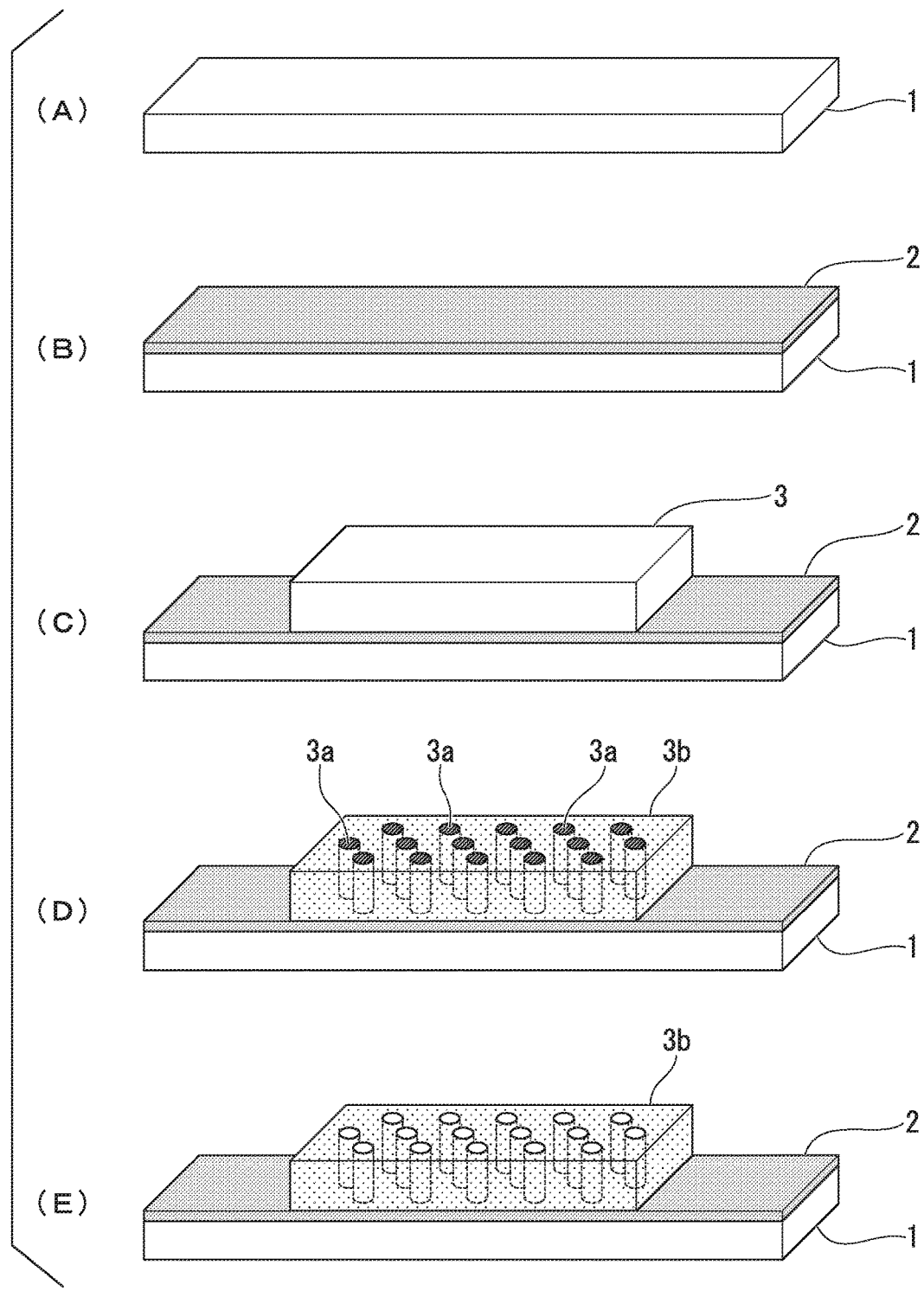

METHOD OF PRODUCING STRUCTURE CONTAINING PHASE-SEPARATED STRUCTURE, BLOCK COPOLYMER COMPOSITION, AND ORGANIC SOLVENT USED FOR BLOCK COPOLYMER COMPOSITION

TECHNICAL FIELD

The present invention relates to a method of producing a structure containing a phase-separated structure, a block copolymer composition, and an organic solvent used for the block copolymer composition.

Priority is claimed on Japanese Patent Application No. 2015-096328, filed May 11, 2015, the content of which is incorporated herein by reference.

DESCRIPTION OF RELATED ART

Recently, as further miniaturization of large scale integrated circuits (LSI) proceeds, a technology for processing a more delicate structure is demanded. In response to such demand, attempts have been started in which a fine pattern is formed using a phase-separated structure formed by self-assembly of a block copolymer having mutually incompatible blocks bonded together (see, for example, Patent Document 1).

For using a phase-separation structure of a block copolymer, it is necessary to form a self-organized nano structure by a microphase separation only in specific regions, and orient the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

In the formation of a microphase-separated structure, a polymeric compound in which a plurality of kinds of blocks (partial constituent component in which the same kind of structural units are repeatedly bonded) are bonded is dissolved in a solvent to be used as a block copolymer composition (see, for example, Patent Literature 2).

DOCUMENTS OF RELATED ART

Patent Literature

[Patent Document 1] Japanese Unexamined Patent Application, First Publication No. 2008-36491
[Patent Literature 2] Japanese Unexamined Patent Application, First Publication No. 2013-212569

Non-Patent Documents

[Non-Patent Document 1] Proceedings of SPIE (U.S.), vol. 7637, pp. 76370G-1 (2010)

SUMMARY OF THE INVENTION

In the formation of a structure containing a phase-separated structure using a block copolymer composition, there was still room for improvement in satisfactorily forming a phase-separated structure.

The present invention takes the above circumstances into consideration, with an object of providing a method of producing a structure containing a phase-separated structure capable of satisfactorily forming a phase-separated structure, a block copolymer composition, and an organic solvent used for the block copolymer composition.

A first aspect of the present invention is a method of forming a structure containing a phase-separated structure, the method including a step A in which a block copolymer composition including an organic solvent component (S) and a block copolymer in which a block of polystyrene or a polystyrene derivative is bonded to at least one kind of block is applied to a substrate to form a layer containing the block copolymer; and a step B in which the layer containing the block copolymer is phase-separated; the value of an interaction distance $Ra_{PS}(MPa^{1/2})$ between the Hansen solubility parameter of the organic solvent component (S) and the Hansen solubility parameter of polystyrene or the polystyrene derivative satisfying the following formula (1).

[Numerical Formula 1.]

$$4.1 \leq Ra_{PS} \leq 9 \quad (1)$$

A second aspect of the present invention is a block copolymer composition including an organic solvent component (S) and a block copolymer in which a block of polystyrene or a polystyrene derivative is bonded to at least one kind of block, the value of an interaction distance $Ra_{PS}(MPa^{1/2})$ between the Hansen solubility parameter of the organic solvent component (S) and the Hansen solubility parameter of polystyrene or the polystyrene derivative satisfying the following formula (1).

[Numerical Formula 2.]

$$4.1 \leq Ra_{PS} \leq 9 \quad (1)$$

A third aspect of the present invention is an organic solvent used for a block copolymer composition used in a method of forming a structure containing a phase-separated structure, the method including a step A in which a block copolymer composition including an organic solvent component (S) and a block copolymer in which a block of polystyrene or a polystyrene derivative is bonded to at least one kind of block is applied to a substrate to form a layer containing the block copolymer; and a step B in which the layer containing the block copolymer is phase-separated, the value of an interaction distance $Ra_{PS}(MPa^{1/2})$ between the Hansen solubility parameter of the organic solvent component (S) and the Hansen solubility parameter of polystyrene or the polystyrene derivative satisfying the following formula (1).

[Numerical Formula 3.]

$$4.1 \leq Ra_{PS} \leq 9 \quad (1)$$

According to the present invention, there is provided a method of producing a structure containing a phase-separated structure capable of satisfactorily forming a phase-separated structure, a block copolymer composition, and an organic solvent used for the block copolymer composition.

BRIEF DESCRIPTION OF THE DRAWINGS

FIG. 1 is a diagram showing one example of schematic steps of the method of forming a structure containing a phase-separated structure according to the present embodiment.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent ($R^\alpha$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "styrene derivative" refers to a compound in which the hydrogen atom on the α-position of styrene is substituted with a substituent such as an alkyl group, a halogenated alkyl group or the like.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The case of describing "may have a substituent" includes both of the case where the hydrogen atom (—H) is substituted with a monovalent group and the case where the methylene group (—$CH_2$—) is substituted with a divalent group.

The term "exposure" is used as a general concept that includes irradiation with any form of radiation.

<Method of Producing Structure Containing Phase-Separated Structure>

A first aspect of the present invention is a method of forming a structure containing a phase-separated structure, the method including a step A in which a block copolymer composition including an organic solvent component (S) and a block copolymer in which a block of polystyrene or a polystyrene derivative is bonded to at least one kind of block is applied to a substrate to form a layer containing the block copolymer; and a step B in which the layer containing the block copolymer is phase-separated; the value of an interaction distance $Ra_{PS}(MPa^{1/2})$ between the Hansen solubility parameter of the organic solvent component (S) and the Hansen solubility parameter of polystyrene or the polystyrene derivative satisfying the following formula (1).

[Numerical Formula 4.]

$$4.1 \leq Ra_{PS} \leq 9 \quad (1)$$

Hereinafter, the method of producing a structure containing a phase-separated structure of the present embodiment will be specifically described with reference to the drawings.

FIG. 1 shows one example of schematic steps of the method of forming a structure containing a phase-separated structure according to the present embodiment.

In the present embodiment, a block copolymer composition containing an organic solvent in which the value of the interaction distance (Ra) between the Hansen solubility parameter of the organic solvent and the Hansen solubility parameter of polystyrene or a polystyrene derivative thereof is within a predetermined range is used.

Firstly, as shown in FIG. 1 (A), a block copolymer composition containing a block of polystyrene or a polystyrene derivative bonded to at least one kind of block is applied to a substrate 1, so as to form a layer 3 containing the block copolymer on the substrate 1, as shown in FIG. 1 (C).

In the present embodiment, as shown in FIG. 1 (B), it is preferable to form a neutralization film 2 on the substrate 1, and then form a layer 3 containing a block copolymer on the neutralization film 2.

Then, as shown in FIG. 1 (D), the layer containing the block copolymer is phase-separated, so as to obtain a structure containing a phase separated structure in which the layer containing the block copolymer is phase-separated into a phase of $P_A$ block (3a in FIG. 1 (D)) and a phase of $P_B$ block (3b in FIG. 1 (D)).

<<Step A>>

In step (A), a block copolymer composition containing an organic solvent component (S) and a block copolymer in which a block of polystyrene or a polystyrene derivative is bonded to at least one kind of block is applied to a substrate to form a layer containing the block copolymer. The block copolymer composition used in step A will be described later.

Formation of the layer containing the block copolymer may be conducted by a conventional method. Specifically, for example, a block copolymer composition is applied to a substrate using a spinner or the like, followed by a bake treatment preferably at 80 to 150° C. for 40 to 120 seconds, more preferably for 60 to 90 seconds, so as to form a layer containing the block copolymer.

The thickness of the layer containing the block copolymer is not particularly limited, and is preferably in the range of 30 to 250 nm, and more preferably 50 to 150 nm.

In step A, prior to applying the block copolymer composition to the substrate 1, it is preferable to form a neutralization film 2 (neutralization film 2 in FIG. 1 (B)) on the substrate.

The neutralization film may be formed by applying a resin composition for forming the neutralization film to a substrate, followed by a bake treatment at 100 to 300° C. for 40 to 120 seconds, preferably 60 to 90 seconds, so as to form a neutralization film. After the baking treatment, non-adhered portions are removed from the substrate by a solvent such as a thinner, so as to form a neutralization film.

The thickness of the neutralization film is not particularly limited, and is preferably 1 to 20 nm, and more preferably 5 to 15 nm.

The neutralization film 2 is formed so as to modify the surface of the substrate to exhibit affinity for all polymers constituting the block copolymer.

By forming the neutralization film, it becomes possible to prevent only phases of specific polymers to come into contact with the surface of the substrate by phase separation. For this reason, in order to form a phase-separated structure having a lamellar structure oriented in a direction perpendicular to the substrate surface, before forming a layer containing a block copolymer, it is preferable to form a layer of the neutralization film on the substrate surface depending on the type of the block copolymer to be used.

Specifically, a neutralization film containing a surface treating agent having affinity for all polymers constituting the block copolymer is formed on the surface of the substrate.

As the neutralization film, a film composed of a resin composition can be used. The resin composition used for forming the neutralization film may be appropriately selected from conventional resin compositions used for forming a thin film, depending on the type of polymers constituting the block copolymer. The resin composition used for forming the neutralization film may be a heat-polymerizable resin composition, or a photosensitive resin composition such as a positive resist composition or a negative resist composition.

Alternatively, a compound may be used as the surface treating agent, and the compound may be coated to form a non-polymerizable film as the neutralization film. For example, a siloxane organic monomolecular film formed by using a surface treating agent such as phenethyltrichlorosilane, octadecyltrichlorosilane or hexamethyldisilazane may be preferably used as a neutralization film.

The neutralization film composed of such surface treating agent can be formed by a conventional method.

Examples of the surface treating agent include a resin composition containing all structural units of the polymers constituting the block copolymer, and a resin containing all structural units having high affinity for the polymers constituting the block copolymer.

For example, when a block copolymer of polystyrene (hereafter, sometimes referred to as "PS") and methyl polymethacrylate (hereafter, sometimes referred to as "PMMA") is used, as the surface treating agent, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

The kind of the substrate is not particularly limited, as long as a block copolymer composition can be coated thereon. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate used in the present embodiment is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate, an inorganic and/or organic film may be provided. As the inorganic film, an inorganic antireflection film (inorganic BARC) can be used. As the organic film, an organic antireflection film (organic BARC) can be used.

Before forming a neutralization film on the substrate, the surface of the substrate may be cleaned. By cleaning the surface of the substrate, the neutralization film may be satisfactorily formed.

As the cleaning treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing the resin composition for forming a phase-separated structure can be formed on the surface of the substrate.

<<Step B>>

In step B, the layer containing the block copolymer obtained in step A is phase-separated.

The phase-separation of the layer containing a block copolymer (i.e., layer 3 in FIG. 1) is performed by heat treatment after the formation of the layer containing a block copolymer, thereby forming a phase-separated structure. The heat treatment is preferably conducted at a temperature at least as high as the glass transition temperature of the layer containing the mixture of the block copolymer used and lower than the heat decomposition temperature. For example, in the case where the block copolymer is PS-PMMA (Mn:150,000-50,000), the heat treatment is preferably conducted at 150 to 270° C., more preferably 200 to 250° C., and most preferably 210 to 230° C. The heat treatment time is preferably 30 to 3,600 seconds, and more preferably 120 to 600 seconds.

Further, the heat treatment is preferably conducted in a low reactive gas such as nitrogen.

By the above heat treatment, a structure containing a phase separated structure in which the layer containing the mixture of the block copolymer is phase-separated into a phase of the block 3a and a phase of the block 3b can be formed.

In the present embodiment, a method in which a photosensitive resin composition or the like is used as a physical guide to control the orientation of the phase-separated pattern (graphoepitaxy) may be used.

In the manner as described above, a structure containing a phase-separated structure formed along the photosensitive resin pattern can be obtained.

<<Optional Step>>

In the present embodiment, after step B, a pattern may be formed by selectively removing a phase of at least one block of the plurality of blocks constituting the block copolymer from the layer containing the block copolymer.

Specifically, from the layer containing the block copolymer on the substrate after formation of the phase-separated structure, the block within the phase of block $P_A$ (phase 3a in FIG. 1 (D)) is selectively removed (rendered low-molecular weight), so as to form a pattern of block $P_B$ (phase 3b in FIG. 1 (E)).

At this time, at least a part of the block within the phase of block $P_A$ (phase 3a in FIG. 1 (D)) may be selectively removed (rendered low-molecular weight), so as to form a pattern. By selectively removing a portion of the block $P_A$ in advance, the solubility in a developing solution can be enhanced. As a result, the phase constituted of the block $P_A$ can be more reliably removed by selective removing than the phase constituted of the block $P_B$.

The selective removal treatment is not particularly limited, as long as it is a treatment capable of decomposing and removing the $P_A$ block without affecting the $P_B$ block. The selective removal treatment can be appropriately selected from any methods for removing a resin film, depending on the kinds of the $P_A$ block and the $P_B$ block. Further, when a neutralization film is formed on the surface of the substrate in advance, the neutralization film is removed together with the phase of the $P_A$ block. Examples of the removal treatment include an oxygen plasma treatment, an ozone treatment, a UV irradiation treatment, a heat decomposition treatment and a chemical decomposition treatment.

The substrate having a pattern formed by the phase-separation of the layer containing the block copolymer as described above may be used as it is, or a further heat treatment may be conducted to modify the shape of the polymeric nano structure on the substrate. The heat treatment is preferably conducted at a temperature at least as high as the glass transition temperature of the block copolymer used and lower than the heat decomposition temperature. Further, the heat treatment is preferably conducted in a low reactive gas such as nitrogen.

<<Block Copolymer Composition>>

In step A, as the block copolymer composition used for forming a layer containing the block copolymer, a block copolymer composition containing a block copolymer in which a block of polystyrene or a polystyrene derivative is bonded to at least one kind of block may be used.

The block copolymer composition contains an organic solvent component (S), and the value of an interaction distance $Ra_{PS}(MPa^{1/2})$ between the Hansen solubility parameter of the organic solvent component (S) and the Hansen solubility parameter of polystyrene or the polystyrene derivative satisfies the following formula (1).

[Numerical Formula 5.]

$$4.1 \leq Ra_{PS} \leq 9 \quad (1)$$

(Organic Solvent Component (S))

The predetermined Hansen solubility parameter to be satisfied by the organic solvent component (S) may be calculated, for example, a predetermined parameter based on the solubility parameter and agglomeration described in "Hansen Solubility Parameters: A User's Handbook], CRC Press (2007) by Charles Hansen and "The CRC Handbook and Solubility Parameters and Cohesion Parameters," (1999) edited by Allan F. M. Barton.

The Hansen solubility parameter is logically calculated as a numerical constant, and is a useful tool for predicting the solubility performance of a solvent for dissolving a solute.

The Hansen solubility parameter can be combined as the following 3 Hansen solubility parameters derived experimentally and logically (i.e., δD, δP and δH), and used as a yardstick for the overall strength and selectivity of the material. The following 3 Hansen solubility parameters show the solubility performance of the organic solvent component (S). The unit of the solubility parameter may be given as $MPa^{1/2}$ or $(J/cc)^{0.5}$.

δD: Energy derived from dispersion force between molecules.

δP: Energy derived from polar force between molecules.

δH: Energy derived from hydrogen bond force between the molecules.

The 3 parameters (i.e., δD, δP and δH) are plotted on a three-dimensional coordinate known as Hansen space.

In the three-dimensional space, as 2 kinds of molecules, i.e., the organic solvent component and polystyrene or a polystyrene derivative becomes closer, it means that the molecules are likely to dissolve each other. That is, in order to determine whether or not the parameters of 2 kinds of molecules, i.e., the organic solvent component and polystyrene or a polystyrene derivative are close or not, for calculating the distance (Ra) between Hansen parameters in the Hansen space, the following formula is used.

[Numerical Formula 6.]

$$(Ra)^2 = 4(\delta_{d2} - \delta_{d1})^2 + (\delta_{p2} - \delta_{p1})^2 + (\delta_{h2} - \delta_{h1})^2$$

In the formula, $\delta_{d2}$ represents a solubility constant of the organic solvent component (S) generated by non-polar dispersion energy;

$\delta_{p2}$ represents a solubility constant of the organic solvent component (S) generated by polar energy by permanent dipole;

$\delta_{h2}$ represents a solubility constant of the organic solvent component (S) generated by energy of hydrogen bond;

$\delta_{d1}$ represents a solubility constant of polystyrene or a polystyrene derivative generated by non-polar dispersion energy;

$\delta_{p1}$ represents a solubility constant of polystyrene or a polystyrene derivative generated by polar energy by permanent dipole;

and $\delta_{h1}$ represents a solubility constant of polystyrene or a polystyrene derivative generated by energy of hydrogen bond.

The Hansen solubility parameter may be calculated by "Molecular Modeling Pro] software, version 5.1.9 (ChemSW, Fairfield Calif., www.chemsw.com) or Dynacomp Software.

With respect to the organic solvent component (S) contained in the block copolymer composition used in the present embodiment, the value of an interaction distance $Ra_{PS}(MPa^{1/2})$ between the Hansen solubility parameter of the organic solvent component (S) and the Hansen solubility parameter of polystyrene or the polystyrene derivative satisfies the following formula (1).

[Numerical Formula 7.]

$$4.1 \leq Ra_{PS} \leq 9 \quad (1)$$

A block copolymer containing a block of polystyrene or a polystyrene derivative exhibits a high solubility in the organic solvent component (S) which satisfies the above formula (1). By virtue of using the organic solvent component (S) which satisfies the above formula (1), generation of impurities in the block copolymer composition can be reduced, and a phase-separated structure can be satisfactorily formed.

Examples of organic solvent which satisfies the above formula (1) include ketones, such as acetone, methyl ethyl ketone, methyl amyl ketone ($Ra_{PS}$: 4.9), cyclohexanone, methyl n-pentyl ketone, methyl isopentyl ketone and 2-heptanone; compounds having an ester bond, such as 3-methoxybutylacetate ($Ra_{PS}$: 8.3), esters, such as methyl acetate, ethyl acetate and butyl acetate ($Ra_{PS}$: 6.4).

These solvents can be used individually, or in combination as a mixed solvent.

In Table 1 shown below, δD, δP, δH of methyl amyl ketone, butyl acetate, 3-methoxybutylacetate and propyleneglycol monomethylether acetate, and the interaction distances with the Hansen solubility parameter of polystyrene (indicated as "$Ra_{PS}$" in Table 1) are indicated.

TABLE 1

|  | δD | δP | δH | $Ra_{PS}$ |
|---|---|---|---|---|
| Methyl amyl ketone | 16.2 | 5.7 | 4.1 | 4.9 |
| Butyl acetate | 15.8 | 3.7 | 6.3 | 6.4 |
| 3-methoxybutyl acetate | 15.3 | 4.1 | 8.1 | 8.3 |
| Propyleneglycol monomethyether acetate | 15.6 | 5.6 | 9.8 | 9.1 |

In the present embodiment, formula (1) is preferably represented by formula (1-1) shown below, and most preferably represented by formula (1-1-1) shown below.

[Numerical Formula 8.]

$$5.0 \leq Ra_{PS} \times 8.8 \quad (1-1)$$

$$6.5 \leq Ra_{PS} \leq 8.8 \quad (1-1-1)$$

In the present embodiment, it is preferable that the organic solvent component (S), in addition to the above formula (1), the value of the interaction distance $Ra_{PE}(MPa^{1/2})$ between the Hansen solubility parameter of the organic solvent component (S) and the Hansen solubility parameter of polyethylene satisfy the following formula (2).

[Numerical Formula 9.]

$$7.2 \leq Ra_{PE} 10.7 \quad (2)$$

Polyethylene exhibits low solubility in an organic solvent component (S) which satisfies the above formula (2). Polyethylene is a resin used as a filter material, and is used in purification steps of various solvents used in semiconductor photolithography.

Polyethylene exhibits low solubility in an organic solvent component (S) which satisfies the above formula (2). Therefore, in the purification step, the filter is unlikely to be damaged, and mixing of impurities eluted from the filter can be prevented. As a result, mixing of impurities in the block copolymer composition can be reduced, and a phase-separated structure can be satisfactorily formed.

In Table 2 shown below, δD, δP, δH of methyl amyl ketone, butyl acetate, 3-methoxybutylacetate and propyleneglycol monomethylether acetate, and the interaction distances with the Hansen solubility parameter of polyethylene (indicated as "$Ra_{PE}$" in Table 2) are indicated.

TABLE 2

| | δD | δP | δH | $Ra_{PE}$ |
|---|---|---|---|---|
| Methyl amyl ketone | 16.2 | 5.7 | 4.1 | 7.1 |
| Butyl acetate | 15.8 | 3.7 | 6.3 | 7.2 |
| 3-methoxybutyl acetate | 15.3 | 4.1 | 8.1 | 9.1 |
| Propyleneglycol monomethyether acetate | 15.6 | 5.6 | 9.8 | 10.7 |

Formula (2) is preferably represented by formula (2-1) shown below, and most preferably represented by formula (2-1-1) shown below.

[Numerical Formula 10.]

$$8.0 \leq Ra_{PE} \leq 10.0 \quad (2-1)$$

$$8.5 \leq Ra_{PE} \leq 9.5 \quad (2-1-1)$$

In the present embodiment, as the organic solvent component (S), it is preferable to use 3-methoxybutyl acetate.

(Block Copolymer)

In the present embodiment, a block copolymer in which a block of polystyrene or a polystyrene derivative is bonded to at least one kind of block is used.

A block copolymer is a polymeric material in which plurality of blocks (partial constitutional components in which the same kind of structural unit is repeatedly bonded) are bonded. As the blocks constituting the block copolymer, 2 kinds of blocks may be used, or 3 or more kinds of blocks may be used.

In the present embodiment, the plurality of blocks constituting the block copolymer are not particularly limited, as long as they are combinations capable of causing phase separation with a block of polystyrene or a polystyrene derivative. However, it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks.

Further, it is preferable to use a combination in which a phase of at least one block amongst the plurality of blocks constituting the block copolymer can be easily subjected to selective removal as compared to the phases of other blocks. An example of a combination which can be selectively removed reliably include a block copolymer in which one or more blocks having an etching selectivity of more than 1 are bonded.

In the present specification, a "period of a block copolymer" refers to a period of a phase structure observed when a phase-separated structure is formed, and is a sum of the lengths of the phases which are mutually incompatible. Specifically, in the case of forming a cylinder structure which has a phase-separated structure perpendicular to a surface of a substrate, the period of the block copolymer is the center distance (pitch) of two mutually adjacent cylinder structures.

The period of a block polymer is determined by intrinsic polymerization properties such as the polymerization degree N and the Flory-Huggins interaction parameter χ. Specifically, the repulsive interaction between different block components of the block copolymer becomes larger as the χN becomes larger. Therefore, when χN>10 (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different blocks. Therefore, by adjusting the composition and the total molecular weight of the block copolymer to be used, the period of the block copolymer can be adjusted.

Examples of the block copolymer include a block copolymer in which a block of polystyrene or a polystyrene derivative is bonded to a block of a structural unit derived from (α-substituted) acrylic acid ester; a block of polystyrene or a polystyrene derivative is bonded to a block of a structural unit derived from (α-substituted) acrylic acid; and a block copolymer in which a block of polystyrene or a polystyrene derivative is bonded to a block of a structural unit derived from siloxane or a derivative thereof.

Examples of polystyrene derivative include poly-α-methylstyrene, poly-2-methylstyrene, poly-3-methylstyrene, poly-4-methylstyrene, poly-4-t-butylstyrene, poly-4-n-octylstyrene, poly-2,4,6-trimethylstyrene, poly-4-methoxystyrene, poly-4-t-butoxystyrene, poly-4-hydroxystyrene, poly-4-nitrostyrene, poly-3-nitrostyrene, poly-4-chlorostyrene, poly-4-fluorostyrene, poly-4-acetoxyvinylstyrene, poly-4-vinylbenzylchloride, poly-1-vinylnaphthalene, poly-4-vinylbiphenyl, poly-1-vinyl-2-pyrolidone, poly-9-vinylanthracene, and poly-vinylpyridine.

An (α-substituted) acrylic acid refers to either or both acrylic acid and a compound in which the hydrogen atom bonded to the carbon atom on the α-position of acrylic acid has been substituted with a substituent. As an example of such a substituent, an alkyl group of 1 to 5 carbon atoms can be given.

Examples of (α-substituted) acrylic acid include acrylic acid and methacrylic acid.

An (α-substituted) acrylate ester refers to either or both acrylate ester and a compound in which the hydrogen atom bonded to the carbon atom on the α-position of acrylate ester has been substituted with a substituent. As an example of such a substituent, an alkyl group of 1 to 5 carbon atoms can be given.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate. Among these, methyl acrylate, ethyl acrylate, t-butyl acrylate, methyl methacrylate, ethyl methacrylate, and t-butyl methacrylate are preferable.

The number average molecular weight (Mn) (the polystyrene equivalent value determined by gel permeation chromatography) of the block copolymer is 150,000 or more. In the present embodiment, the weight average molecular weight is preferably 160,000 or more, and more preferably 180,000 or more.

The polydispersity (Mw/Mn) of the block copolymer is preferably 1.0 to 3.0, more preferably 1.0 to 1.5, and still more preferably 1.0 to 1.3. Mw indicates the weight average molecular weight.

<Block Copolymer Composition>

A second aspect of the present invention is a block copolymer composition including an organic solvent component (S) and a block copolymer in which a block of polystyrene or a polystyrene derivative is bonded to at least one kind of block, the value of an interaction distance $Ra_{PS}(MPa_{1/2})$ organic solvent component (S) and the Hansen solubility parameter of polystyrene or the polystyrene derivative satisfying the following formula (1).

[Numerical Formula 11.]

$$4.1 \leq Ra_{PS} \leq 9 \quad (1)$$

The block copolymer composition according to the second aspect of the present invention is the same as defined for the block copolymer composition described in the method of forming a structure containing a phase-separated structure according to the first aspect of the present invention.

<Organic Solvent>

A third aspect of the present invention is an organic solvent used for a block copolymer composition used in a method of forming a structure containing a phase-separated structure, the method including a step A in which a block copolymer composition including an organic solvent component (S) and a block copolymer in which a block of polystyrene or a polystyrene derivative is bonded to at least one kind of block is applied to a substrate to form a layer containing the block copolymer; and a step B in which the layer containing the block copolymer is phase-separated, the value of an interaction distance $Ra_{PS}(MPa^{1/2})$ between the Hansen solubility parameter of the organi solvent component (S) and the Hansen solubility parameter of polystyrene or the polystyrene derivative satisfying the following formula (1).

[Numerical Formula 12.]

$$4.1 \leq Ra_{PS} \leq 9 \quad (1)$$

The organic solvent according to the third aspect of the present invention is the same as defined for the organic solvent contained in the block copolymer composition described in the method of forming a structure containing a phase-separated structure according to the first aspect of the present invention.

Examples

The present invention will be described more specifically with reference to the following examples, although the scope of the present invention is by no way limited by these examples.

Preparation of Block Copolymer Composition

Examples 1 to 3, Reference Example 1

A block copolymer of polystyrene (PS) and poly(methyl methacrylate) (PMMA) (Mw: 146,000, PS/PMMA compositional ratio (molar ratio): 74.1/25.9, dispersity: 1.01, period: 47.2 nm) was dissolved in each solvent shown in Table 3, so as to prepare block copolymer compositions of Examples 1 to 3 and Reference Example 1.

In Table 3, the value of the interaction distance $Ra_{PS}$ ($MPa^{1/2}$) between the Hansen solubility parameter of each solvent and the Hansen solubility parameter of polystyrene is indicated as "$Ra_{PS}$".

TABLE 3

| | Solvent | CDU/CD | Opening ratio (%) | Phase-separation performance |
|---|---|---|---|---|
| Example 1 | 3-methoxybutyl acetate $Ra_{PS}$ = 8.3 | 0.21 | 91 | A |
| Example 2 | Butyl acetate $Ra_{PS}$ = 6.4 | 0.22 | 93 | A |
| Example 3 | Methyl amyl ketone $Ra_{PS}$ = 4.9 | 0.22 | 75 | B |
| Reference Example 1 | PGMEA $Ra_{PS}$ = 9.1 | 0.23 | 73 | B |

<Method of Producing Structure Containing Phase-Separated Structure>

<<Step A0>>

To an 8-inch silicon wafer, as a neutralization film, a resin 1 shown below (a copolymer having a compositional ratio of l/m/n=80/14/6, Mw:44,000, Mw/Mn:1.73) was dissolved in PGMEA adjusted to a concentration of 0.4% by weight was applied using a spinner, followed by baking at 250° C. for 1 minute and dried, so as to form a neutralization film having a film thickness of 10 nm on the substrate. Thereafter, using a PM thinner, portions not adhered to the wafer were removed by a solvent, so as to obtain a neutralization film on the wafer.

[Chemical Formula 1]

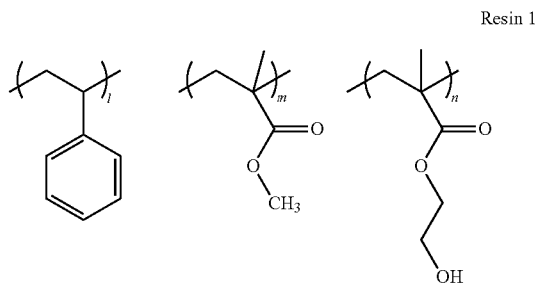

Resin 1

<<Step A>>

Subsequently, on the neutralization film, each block copolymer composition (2.8 wt %) obtained in Examples 1 to 3 and Reference Example 1 was spin-coated (number of rotation: 1,500 rpm, 60 seconds), so as to form a layer containing the block copolymer. The amount of the block copolymer composition applied was 3 cc.

<<Step B>>

The layer formed in step A was baked (100° C. for 60 seconds), and the substrate having the layer formed thereon was heated at 210° C. or 230° C. for 300 seconds while flowing nitrogen for annealing, so as to form a phase-separated structure.

The selective removal treatment of the blocks was conducted, thereby forming a hole pattern.

[Opening Ratio]

The formed hole pattern was subjected to image analysis, and the opening ratio was determined. The results are indicated under "opening ratio (%)" in Table 3.

[Evaluation of in-Plane Uniformity (CDU/CD) of Pattern Size]

With respect to the formed hole pattern, the in-plane uniformity (CDU/CD) of the pattern size was evaluated.

With respect to each hole pattern obtained above, 100 holes in the CH pattern were observed from the upper side thereof using a lengthwise measuring scanning electron microscope (SEM) (product name: S-9380, manufactured by Hitachi High-Technologies Corporation; acceleration voltage: 300V), and the hole diameter (CD; nm) of each hole was measured. From the results, the value of 3 times the standard deviation σ (i.e., 3σ was determined as "CDU (nm)".

The smaller the thus determined 3σ value is, the higher the level of the dimension uniformity (CD uniformity) of the plurality of holes formed in the resist film.

The value obtained by dividing "CDU (nm)" by the hole diameter of each hole (CD; nm) is indicated as "CDU/CD" in Table 3.

[Phase-Separation Performance]

Taking into consideration the opening ratio determined above and the value of CDU/CD, the "phase-separation performance" was evaluated as "A" or "B". The results are shown in Table 3. The criteria "A" or "B" means the following.

A: both the opening ratio and the CDU/CD were satisfactory

B: either one of the opening ratio and the CDU/CD was satisfactory

As seen from the results shown above, the block copolymer solution which used butyl acetate, methyl amyl ketone or 3 methoxybutyl acetate as the solvent, the solvent having a value of an interaction distance $Ra_{PS}$ between the Hansen solubility parameter of the solvent and the Hansen solubility parameter in the range of 4.1 to 9, the same level or a high level of phase-separation performance could be achieved, as compared to the case where PGMEA was used as the solvent.

<Solvent Passage Test>

Each solvent shown in Table 4 was filtered under reduced pressure (under nitrogen pressure: 0.04 MPa) using an ultra-high molecular weight polyethylene (UPE) having a pore size of 35 nm, and after passing the solvent at the integrated flow rate (unit: LR) shown in Table 4, the solvent was sampled, and the damage of each solvent on the filter was evaluated.

In Table 4, the value of the interaction distance $Ra_{PE}$ ($MPa^{1/2}$) between the Hansen solubility parameter of each solvent and the Hansen solubility parameter of polyethylene is indicated as "$Ra_{PE}$".

[Evaluation of Particles]

With respect to each solvent after passing the filter as shown in Table 4, evaluation of particles was conducted. To a silicon wafer having a diameter of 300 mm (wafer 1 and wafer 2) was applied each solvent which had been passed through the filter as shown in Table 4 using a spinner (1500 rpm for 1 minute), followed by baking on a hot plate at 80° C. for 60 seconds. Thereafter, the particles on the silicon wafer were observed using a surface observing apparatus SURFSCANSP2 manufactured by KLA-Tencor, and the number of particles were counted. The results are indicated under "number of particles" in Table 4.

In Table 4, "over load" means that the number of particles due to elution from the filter was large, such that the number of particles could not be counted.

As the evaluation of the damage to the filter, examples in which the number of particles due to elution from the filter was small was evaluated "A", and the examples in which the number of particles due to elution from the filter was large was evaluated "C" in Table 4.

TABLE 4

| Solvent | Flow rate | Number of particles | Damage of filter |
|---|---|---|---|
| 3-methoxybutyl acetate | 5LR | 188 | A |
| $Ra_{PE} = 9.1$ | 10LR | 1406 | |
| | 15LR | 359 | |
| | 20LR | 93 | |
| Butyl acetate | 5LR | over load | C |
| $Ra_{PE} = 7.2$ | 10LR | 56348 | |
| | 15LR | over load | |
| | 20LR | 511226 | |
| Methyl amyl ketone | 5LR | over load | C |
| $Ra_{PE} = 7.1$ | 10LR | over load | |
| | 15LR | over load | |
| | 20LR | over load | |
| PGMEA | 5LR | 88 | A |
| $Ra_{PE} = 10.7$ | 10LR | 27 | |
| | 15LR | 58 | |
| | 20LR | 761 | |

As seen from the results shown above, 3-methoxybutyl acetate had small number of particles after passing the filter, and was about the same level as PGMEA.

BRIEF DESCRIPTION OF THE DRAWINGS

1: Substrate
2: Neutralization film
3: Layer of resin composition for forming phase-separated structure
3a: Phase of block $P_B$
3b: Phase of block $P_A$

What is claimed is:

1. A method of forming a structure containing a phase-separated structure, the method comprising:

filtering an organic solvent component (S) using a polyethylene filter;

forming a neutralization film on a silicon substrate;

applying a block copolymer composition comprising the filtered organic solvent component and a block copolymer in which a block of polystyrene is bonded to a block of poly(methyl methacrylate) to the neutralization film on the silicon substrate using a spinner to form a layer containing the block copolymer; and phase-separating the layer containing the block copolymer by heat treatment at 210° C. to 230° C. for 120 to 600 seconds, wherein a value of an interaction distance $Ra_{PS}(MPa^{1/2})$ between the Hansen solubility parameter of the organic solvent component and the Hansen solubility parameter of polystyrene satisfies the following formula (1):

$$4.1 \leq Ra_{PS} \leq 9 \quad (1)$$

wherein the organic solvent component (S) is 3-methoxybutyl acetate.

* * * * *